(12) United States Patent
Kim et al.

(10) Patent No.: US 7,548,446 B2
(45) Date of Patent: **\*Jun. 16, 2009**

(54) PHASE CHANGE MEMORY DEVICE AND ASSOCIATED WORDLINE DRIVING CIRCUIT

(75) Inventors: Hye-jin Kim, Seoul (KR); Du-eung Kim, Yongin-si (KR); Beak-hyung Cho, Hwaseong-si (KR); Hyung-rok Oh, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/319,604

(22) Filed: Dec. 29, 2005

(65) Prior Publication Data

US 2006/0209616 A1   Sep. 21, 2006

(30) Foreign Application Priority Data

Mar. 21, 2005   (KR) ...................... 10-2005-0023242

(51) Int. Cl.
*G11C 11/00*   (2006.01)

(52) U.S. Cl. .............. 365/148; 365/230.08; 365/230.03

(58) Field of Classification Search .................. 365/148, 365/230.06, 230.03
See application file for complete search history.

(56) References Cited

U.S. PATENT DOCUMENTS

| | | | |
|---|---|---|---|
| 6,667,900 B2 | 12/2003 | Lowrey et al. | |
| 6,735,104 B2 | 5/2004 | Scheuerlein | |
| 7,123,535 B2 * | 10/2006 | Kurotsuchi et al. | ......... 365/148 |
| 2004/0027908 A1 | 2/2004 | Ooishi et al. | |
| 2004/0051094 A1 | 3/2004 | Ooishi | |

FOREIGN PATENT DOCUMENTS

JP   2004-110867   4/2004

* cited by examiner

*Primary Examiner*—Huan Hoang
(74) *Attorney, Agent, or Firm*—Volentine & Whitt, PLLC (57) ABSTRACT

A semiconductor memory device includes a plurality of wordline driving circuits adapted to control the voltage level of a sub-wordline in response to a logic state of a global wordline and an address signal. The wordline driving circuit comprises first and second transistors configured to maintain the sub-wordline at a first voltage level when the global wordline and the address signal have a first logic state and at a second voltage level when the global wordline or the address signal have a second logic state.

30 Claims, 11 Drawing Sheets

PHASE CHANGE MEMORY DEVICE AND ASSOCIATED WORDLINE DRIVING CIRCUIT

BACKGROUND OF THE INVENTION

1. Field of the Invention

The present invention relates generally to a semiconductor memory device. More particularly, the invention relates to a phase change memory device having a wordline driving circuit with a reduced layout size.

A claim of priority is made to Korean Patent Application No. 10-2005-0023242 filed on Mar. 21, 2005, the disclosure of which is hereby incorporated by reference in its entirety.

2. Description of Related Art

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

At least one type of phase change memory device—phase change random access memory (PRAM)—uses the amorphous state to represent a logical '1' and the crystalline state to represent a logical '0'. In a PRAM device, the crystalline state is referred to as a "set state", and the amorphous state is referred to as a "reset state". Accordingly, a memory cell in a PRAM stores a logical '1' by "setting" a phase change material in the memory cell to the crystalline state, and the memory cell stores a logical '0' by "resetting" the phase change material to the amorphous state. Various PRAM devices are disclosed, for example, in U.S. Pat. Nos. 6,487,113 and 6,480,438.

The phase change material in a PRAM is converted to the amorphous state by heating the material to above a predetermined melting temperature and then quickly cooling the material. The phase change material is converted to the crystalline state by heating the material at another predetermined temperature below the melting temperature for a set period of time. Accordingly, data is written to memory cells in a PRAM by converting the phase change material in memory cells of the PRAM between the amorphous and crystalline states using heating and cooling as described.

The phase change material in a PRAM typically comprises a compound including germanium (Ge), antimony (Sb), and tellurium (Te), i.e., a "GST" compound. The GST compound is well suited for a PRAM because it can quickly transition between the amorphous and crystalline states by heating and cooling.

Figure 1:
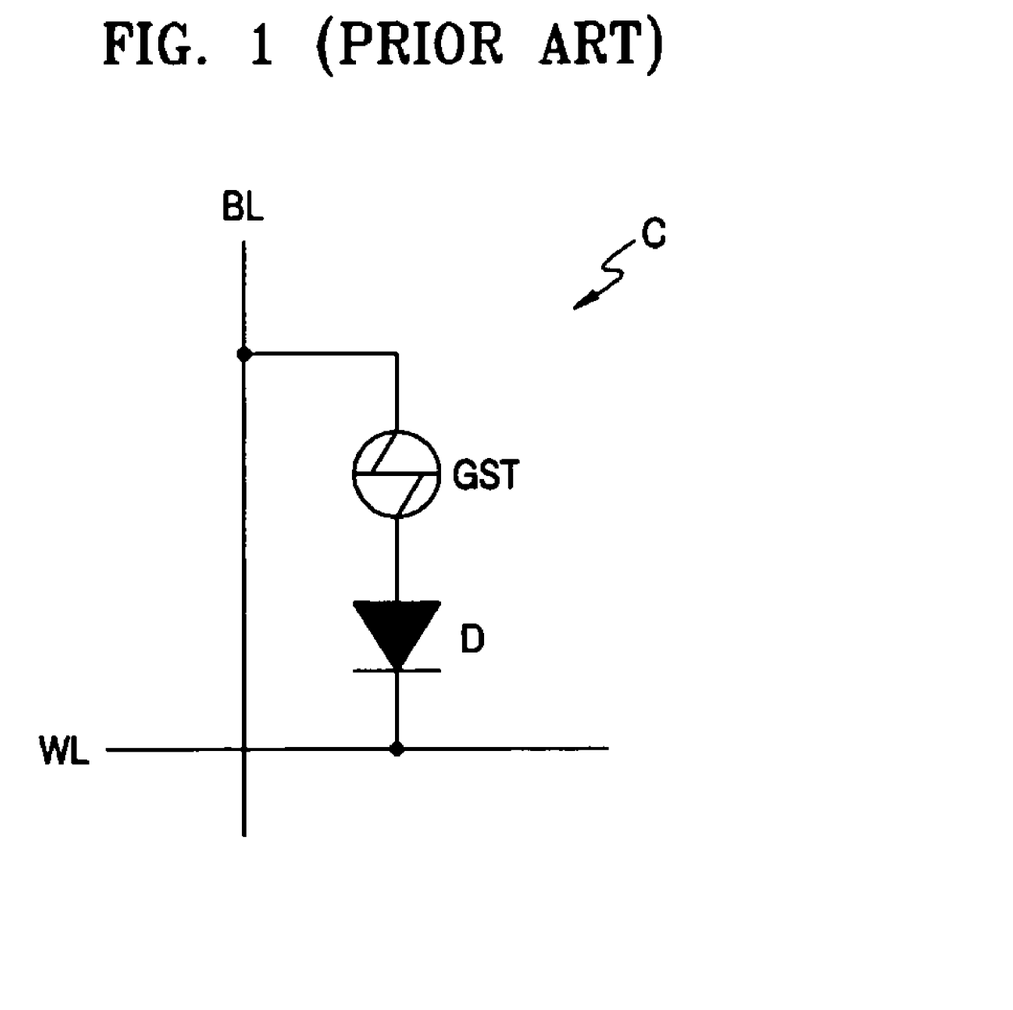
FIG. 1 is a circuit diagram of a conventional phase change memory cell.

FIG. 1 illustrates a conventional phase change memory cell "C" of a diode type PRAM. Referring to FIG. 1, memory cell "C" comprises a phase change resistance element GST connected to a bitline BL, and a diode "D" connected between phase change resistance element GST and a wordline WL.

Phase change memory cell "C" is accessed by selecting wordline WL and bitline BL. In order for phase change memory cell "C" to work properly, wordline WL must have a lower voltage level than bitline BL when wordline WL is selected so that current can flow through phase change resistance element GST. Diode "D" is forward biased so that if wordline WL has a higher voltage than bitline BL, no current flows through phase change resistance element GST. To ensure that wordline WL has a lower voltage level than bitline BL, wordline WL is generally connected to ground when selected.

The operation of memory cell "C" is described in further detail below in the context of a conventional phase change memory device.

Figure 2:
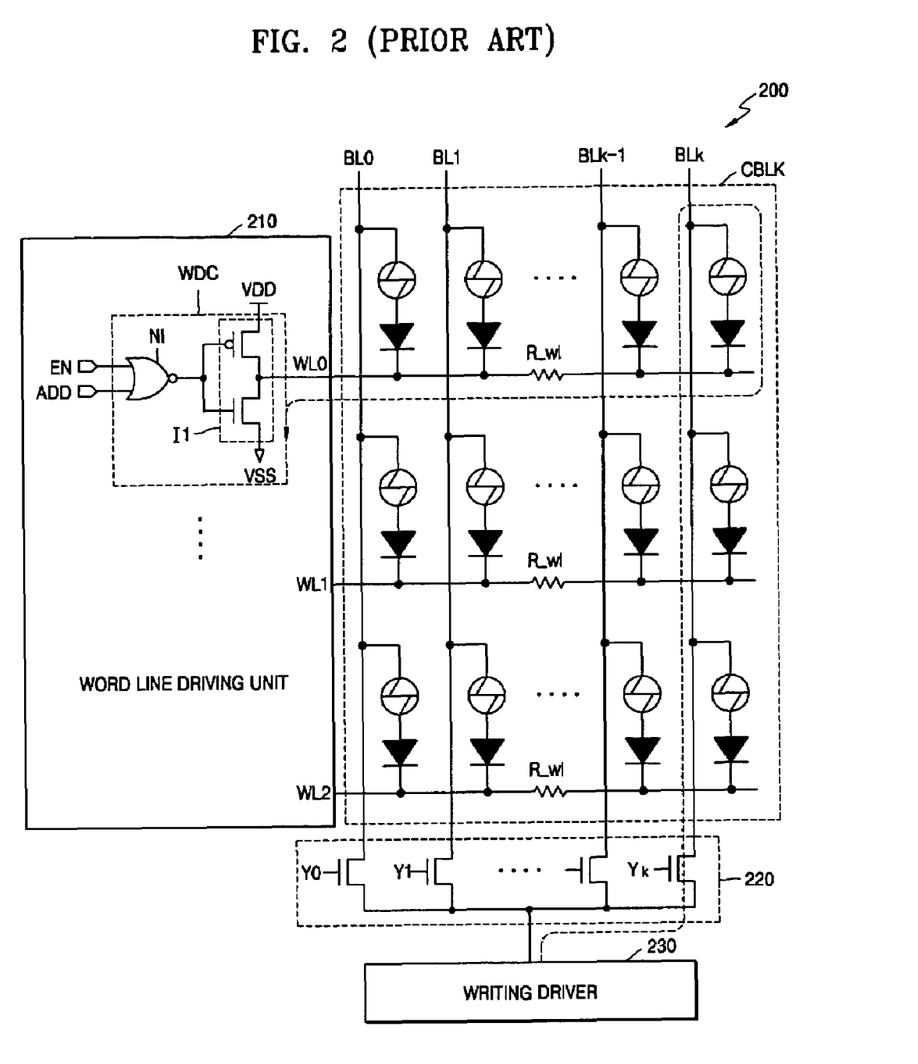
FIG. 2 is a circuit diagram of a conventional phase change memory device including a plurality of phase change memory cells.

FIG. 2 is a diagram of a conventional phase change memory device 200. Referring to FIG. 2, phase change memory device 200 comprises a memory cell block CBLK comprising a plurality of phase change memory cells, a wordline driving unit 210, a column selection circuit 220, and a writing driver 230.

Wordline driving unit 210 comprises a plurality of wordline driving circuits for converting address and activation signals into wordline voltages. For simplicity of illustration, FIG. 2, shows only one wordline driving circuit WDC connected to wordline WL0. Other wordline driving circuits in wordline driving unit 210 function similarly to wordline driving circuit WDC, and therefore a further explanation thereof is omitted to avoid redundancy.

Wordline driving circuit WDC receives an address signal ADD and an activation signal EN and generates a signal on wordline WL0. Wordline driving circuit WDC comprises a NOR gate N1 receiving address signal ADD and activation signal EN, and an inverter I1 receiving an output from NOR gate N1 and generating the signal on wordline WL0.

Column selection circuit 220 selects bitlines according to the voltage levels of column selection signals Y0 through Yk. Writing driver 230 supplies a write current to the selected bitlines.

To illustrate the operation of a selected memory cell in memory device 200, it will be assumed that wordline WL0 and bitline BLk are selected. Wordline WL0 is selected by setting activation signal EN and address signal ADD to logical '0' so that the output of NOR gate N1 is a logical '1', causing wordline WL0 to be connected to ground VSS through inverter I1. Bitline BLk is selected by setting column selection signal Yk to logical '1' so that writing driver 230 provides the write current to bitline BLk. The write current flows through bitline BLk to ground VSS through the memory cell and wordline driving circuit WDC, as indicated by a dotted line in FIG. 2.

One shortcoming of memory device 200 is that the wordline driving circuits take up a significant amount of chip space. By occupying so much chip space, the wordline driving circuits limit the number of memory cells that can be formed in memory device 200.

SUMMARY OF THE INVENTION

According to one embodiment of the invention, a semiconductor memory device comprises n global wordlines, n groups of m sub-wordlines corresponding to the n global wordlines, and n groups of m wordline driving circuits controlling respective voltage levels of the sub-wordlines in response to logic levels of the global wordlines and m address signals. Each of the wordline driving circuits comprises a first transistor for maintaining a corresponding sub-wordline at a first voltage level and a second transistor for maintaining the corresponding sub-wordline at a second voltage level.

According to another embodiment of the invention, a semiconductor memory device comprises n global wordlines, n groups of m sub-wordlines corresponding to the n global wordlines, and a wordline driving unit driving the sub-wordlines. The wordline driving unit comprises n groups of m wordline driving circuits controlling respective voltage levels of the sub-wordlines in response to logic levels of the global wordlines and m address signals.

According to still another embodiment of the invention, a semiconductor memory device comprises a plurality of memory cell blocks, each receiving n global wordlines and n groups of m sub-wordlines corresponding to the n global wordlines, a plurality of wordline driving units corresponding to the plurality of memory cell blocks and adapted to control voltage levels of the sub-wordlines received by each memory cell block, and a first decoding unit receiving m address signals and applying the m address signals to the wordline driving units. Each of the wordline driving units comprises n groups of m wordline driving circuits, wherein each of the wordline driving circuits is adapted to control the voltage level of a corresponding sub-wordline in response to a logic state of a corresponding one of the global wordlines and a corresponding one of the m address signals.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 3A:
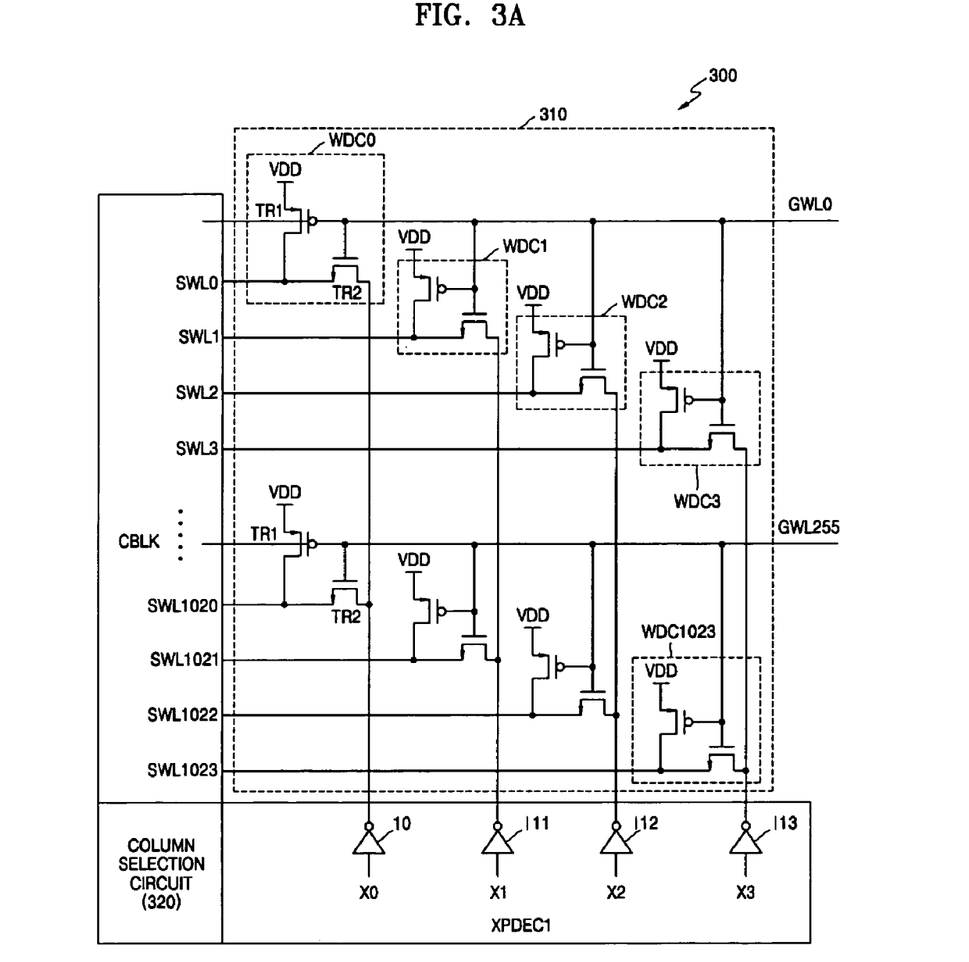
FIG. 3A is a circuit diagram of a semiconductor memory device according to an embodiment of the present invention.
Figure 3B:
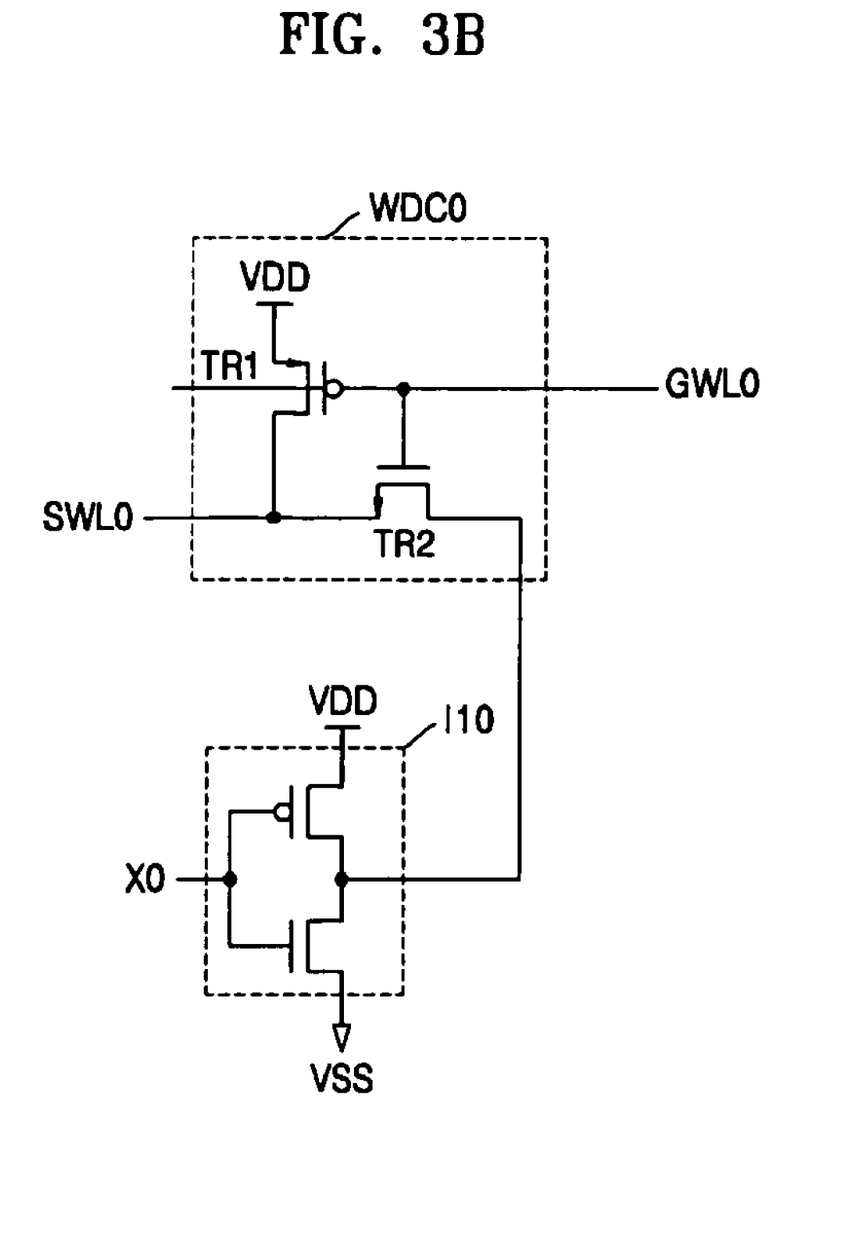
FIG. 3B is a circuit diagram of a wordline driving circuit shown in FIG. 3A; and, FIGS. 4 through 10 are circuit diagrams of various semiconductor memory devices according to various embodiments of the present invention.

FIG. 3A is a circuit diagram of a semiconductor memory device 300 according to an embodiment of the present invention and FIG. 3B is a circuit diagram of a wordline driving circuit shown in FIG. 3A.

Referring to FIG. 3A, semiconductor memory device 300 comprises a memory cell block CBLK, a wordline driving unit 310, a column selection circuit 320, and a first decoding unit XPDEC1.

First decoding unit XPDEC1 comprises a plurality of inverters I10 through I13 receiving and inverting a plurality of respective input address signals X0 through X3. Inverted input address signals X0 through X3 are output from first decoding unit XPDEC1 to wordline driving unit 310.

Wordline driving unit 310 receives inverted input address signals X0 through X3 and a plurality of global wordlines GWL0 through GWL255 and generates a plurality of sub-wordlines SWL0 through SWL1023. Sub-wordlines SWL0 through SWL1023 are divided into groups of four (4) corresponding to global wordlines GWL0 through GWL255.

Wordline driving unit 310 comprises a plurality of wordline driving circuits WDC0 through WDC1023 controlling the voltage levels of respective sub-wordlines SWL0 through SWL1023 in response to logic levels of global wordlines GWL0 through GWL255 and inverted input address signals X0 through X3.

Memory cell block CBLK receives sub-wordlines SWL0 through SWL1023 from wordline driving circuit and applies sub-wordlines SWL0 through SWL1023 to a plurality of phase change memory cells (not shown).

Column selection circuit 320 is similar to column selection circuit 220 in FIG. 2. In particular, column selection circuit 320 outputs a plurality of bitlines providing current to selected memory cells in memory cell block CBLK in response to a plurality of corresponding column selection signals.

Although semiconductor memory device 300 comprises specific numbers and groupings of global wordlines, sub-wordlines, wordline driving circuits, input address signals, and so forth, those skilled in the art will recognize that these numbers and groupings are exemplary, and can be readily varied.

Each of wordline driving circuits WDC0 through WDC1023 comprises first and second transistors gated by a corresponding one of global wordlines GWL0 through GWL255. The first and second transistors switch a sub-wordline between first and second voltage levels depending on a voltage level of the global wordline and the voltage levels of input address signals X0 through X3.

For example, wordline driving circuit WDC0 comprises first and second transistors T1 and T2 gated by global wordline GWL0. First transistor TR1 is a positive metal-oxide semiconductor (PMOS) transistor with a first terminal connected to a power supply providing a power supply voltage VDD, and a second terminal connected to sub-wordline SWL0, and second transistor TR2 is a negative metal-oxide semiconductor (NMOS) transistor with a first terminal connected to sub-wordline SWL0 and a second terminal connected to a selection line receiving inverted input address signal X0.

Where global wordline GWL0 has the first voltage level (e.g., a voltage level "low"), first transistor TR1 is turned on and second transistor TR2 is turned off. Accordingly, current flows through first transistor TR1 and the voltage level of sub-wordline SWL0 becomes power supply voltage VDD.

Where global wordline GWL0 has the second voltage level (e.g., a voltage level "high"), first transistor TR1 is turned off and second transistor TR2 is turned on. In this case, current flows through second transistor TR2 so that sub-wordline SWL0 assumes the voltage level of inverted input address signal X0. The voltage level of inverted input address is either power supply voltage VDD or ground.

The structure of wordline driving circuits WDC1 through WDC1023 is substantially the same as the structure of wordline driving circuit WDC0, and therefore, additional description of these elements is omitted to avoid redundancy.

In semiconductor memory device 300, since each of wordline driving circuits WDC0 through WDC1023 includes only two transistors, the size of wordline driving unit 310 is reduced relative to the size of wordline driving unit 210 in FIG. 2. As a result, wordline driving unit 310 can achieve a higher degree of integration than driving unit 210.

FIG. 3B is a circuit diagram of wordline driving circuit WDC0. FIG. 3B serves to further illustrate the operation of wordline driving circuits WDC0 through WDC1023.

Referring to FIG. 3B, where global wordline GWL0 has the first voltage level, first transistor TR1 is turned on and second transistor TR2 is turned off. As a result, sub-wordline SWL0 receives power supply voltage VDD through first transistor T1.

Where global wordline GWL0 has the second voltage level, first transistor TR1 is turned off and second transistor TR2 is turned on. As a result, sub-wordline SWL0 receives the voltage level of inverted address signal X0 through second transistor TR2.

As shown in FIG. 3B, inverter I10 comprises a NMOS transistor connected to ground VSS and a PMOS transistor connected to the power supply. Where the NMOS transistor is turned on and the PMOS transistor is turned off, a current path is formed between the first terminal of second transistor TR2 and ground VSS. In contrast, where the NMOS transistor is turned off and the PMOS transistor is turned on, a current path is formed between the first terminal of second transistor T2 and the power supply.

Sub-wordline SWL0 is selected by applying the second voltage level to global wordline GWL0 to turn on second transistor TR2 and by setting address input signal X0 to the second voltage level to turn on the NMOS transistor in inverter I10. This causes a path to be formed between sub-wordline SWL0 and ground VSS so that current may flow through corresponding memory cells in memory cell block CBLK when the bitlines for those memory cells are also selected. If one of sub-wordlines SWL1 through SWL3 is selected but sub-wordline SWL0 is not selected, the second voltage level is still applied to global wordline GWL0 to turn on second transistor TR2, but input address signal X0 is set to the first voltage level to turn on PMOS transistor in inverter I10 and therefore connect sub-wordline SWL0 to the power supply.

Each memory cell in memory cell block CBLK comprises a phase change resistance element connected to a bitline, and a diode connected between the phase change resistance element and one of sub-wordlines SWL0 through SWL1023.

Figure 4:
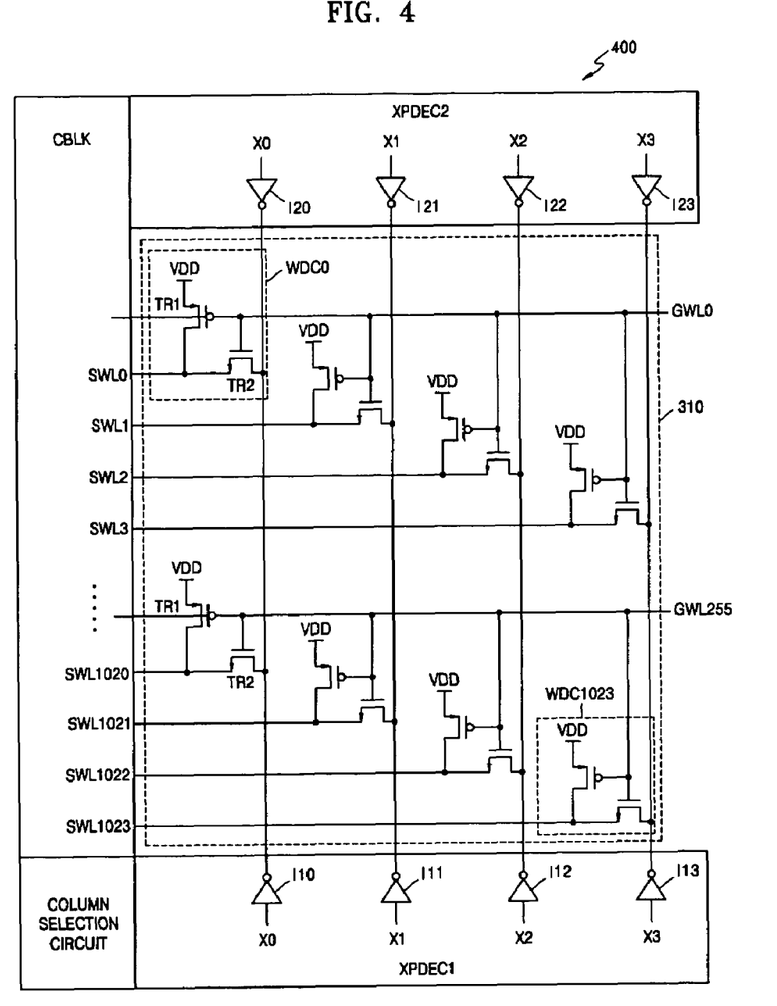

FIG. 4 is a circuit diagram of a semiconductor memory device 400 according to another embodiment of the present invention. The structure of semiconductor memory device 400 is the same as semiconductor memory device 300 in FIG. 3, except that semiconductor memory device 400 includes a second decoding unit XPDEC2.

Second decoding unit XPDEC2 comprises inverters I20 through I23, which invert respective input address signals X0, X1, X2, and X3. Like inverters I10 through I13, each of inverters I20 through I23 has an output terminal connected to respective second terminals of the second transistors in wordline driving circuits WDC0 through WDC1023.

First and second decoding units XPDEC1 and XPDEC2 are located on opposite sides of wordline driving circuits WDC0 through WDC1023 so that sub-wordlines SWL0 through SWL1023 can be controlled from both sides. By controlling each sub-wordline using first and second decoding units XPDEC1 and XPDEC2 at the same time, the electrical load on each sub-wordline becomes half of what it is semiconductor memory device 300.

Due to the modified electrical load on each sub-wordline, and an associated change in current, the pitch of the selection lines connected to the second terminals of the second transistors in FIG. 4 can be reduced relative to the pitch of the selection lines in FIG. 3.

Second decoding unit XPDEC2 of FIG. 4 can be shared by an adjacent memory cell block, as will be described later in further detail.

Figure 5:
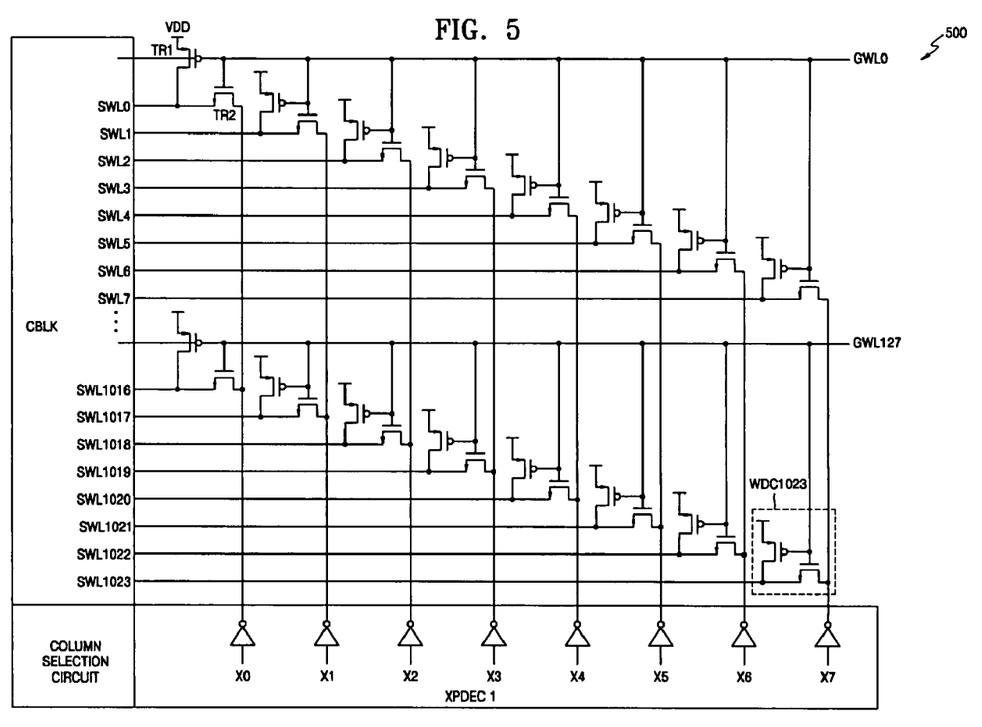

FIG. 5 is a circuit diagram of a semiconductor memory device 500 according to still another embodiment of the present invention.

In semiconductor memory device 500, each global wordline controls eight (8) sub-wordlines instead of four (4) as in FIGS. 3 and 4. Accordingly, semiconductor memory device 500 has only 128 global wordlines controlling sub-wordlines SWL0 through SWL1023 instead of 256. In general, any number of sub-wordlines could be controlled by each global wordline.

Figure 6:
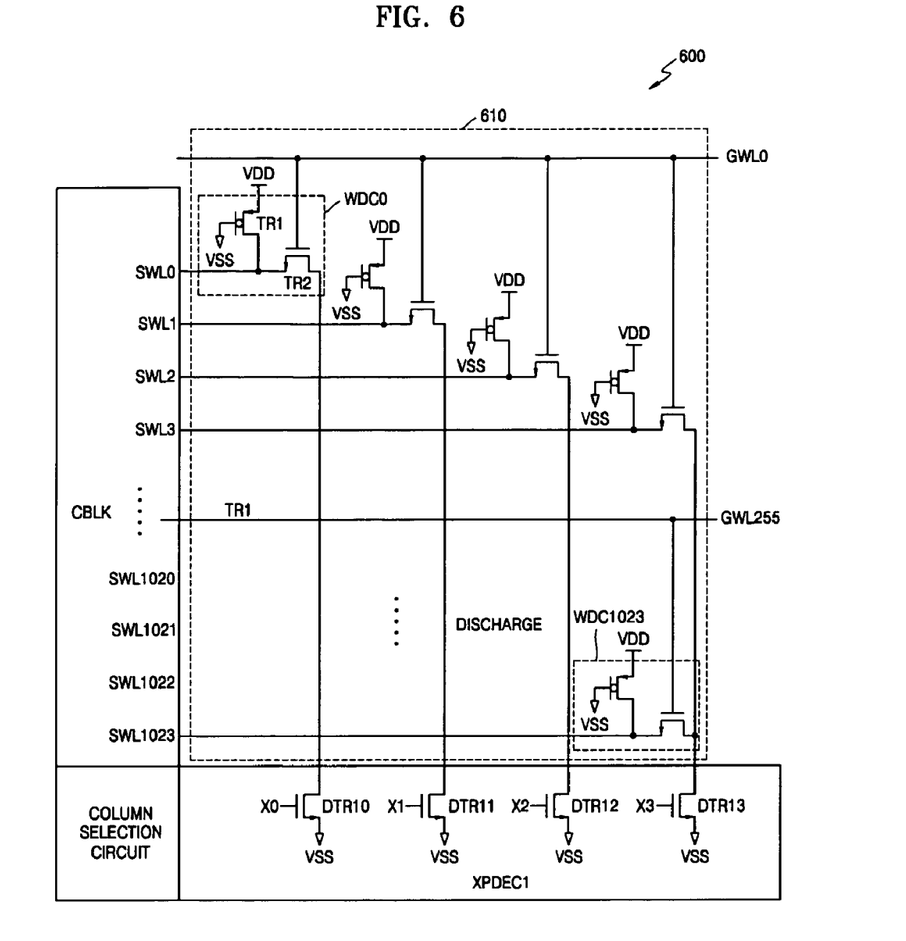

FIG. 6 is a circuit diagram of a semiconductor memory device 600 according to still another embodiment of the present invention.

Referring to FIG. 6, semiconductor memory device 600 has a similar structure to semiconductor memory device 300, except that semiconductor memory device 600 has a different wordline driving unit 610 and a different first decoding unit XPDEC1.

In wordline driving unit 610, each of wordline driving circuits WDC0 through WDC1023 comprises first and second transistors connected to corresponding sub-wordlines as in wordline driving unit 310. However, in wordline driving unit 610, only the second transistor is gated by a global wordline, while the first transistor is gated by ground VSS.

In the first decoding unit XPDEC1 of semiconductor memory device 600, input address signals X0 through X3 are input to the gates of respective decoding transistors DTR10 through DTR13 instead of to inverters I10 through I13. Decoding transistors DTR10 through DTR13 each have a first terminal connected to respective second terminals of corresponding second transistors in wordline driving circuits WDC0 through WDC1023, and a second terminal connected to ground VSS.

Since the gates of the first transistors in wordline driving circuits WDC0 through WDC1023 are connected to ground VSS, the first transistors are always turned on. As a result, sub-wordlines SWL0 through SWL1023 are maintained in a precharged state unless a second transistor and a corresponding decoding transistor are turned on. For instance, first transistor TR1 maintains sub-wordline SWL0 in a precharged state unless second transistor TR2 and decoding transistor DTR10 are turned on to connect sub-wordline SWL0 to ground. When a sub-wordline is connected to ground it is considered "selected".

Second transistor TR2 is slightly larger than first transistor TR1. Hence, the voltage drop across first transistor TR1 is substantially equal to power supply voltage VDD whenever second transistor TR2 is turned on. As a result, when second transistor TR2 is turned on, sub-wordline SWL0 switches to ground.

The operation of wordline driving circuits WDC1 through WDC1023 in semiconductor memory device 600 is substantially the same as the operation of wordline driving circuit WDC0, and therefore further explanation thereof is omitted to avoid redundancy.

Because first decoding unit XPDEC1 in semiconductor memory device 600 includes only one transistor per input address signal, it is smaller than the first decoding unit XPDEC1 in semiconductor memory device 300 of FIG. 3A.

Figure 7:
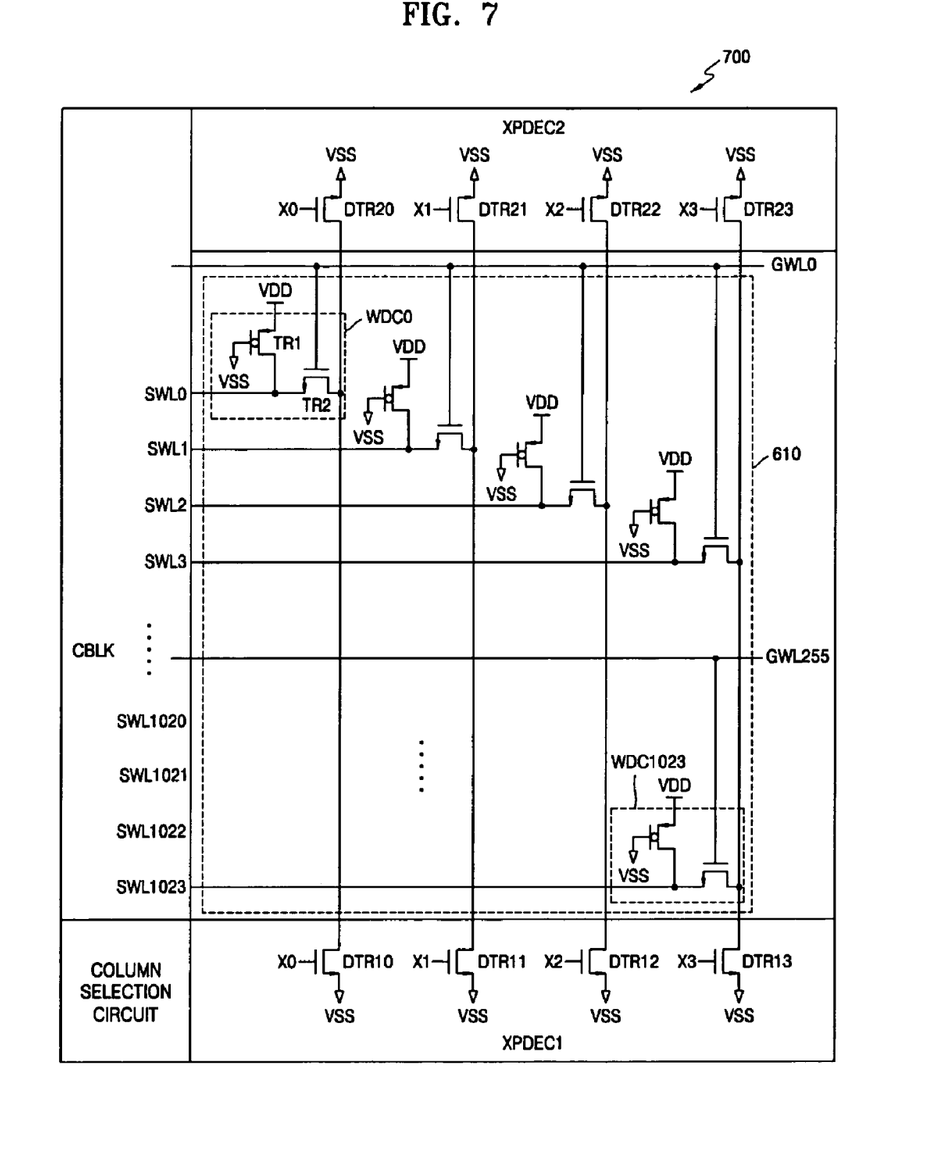

FIG. 7 is a circuit diagram of a semiconductor memory device 700 according to another embodiment of the present invention.

Referring to FIG. 7, the structure of semiconductor memory device 700 is the same as that of semiconductor memory device 600 in FIG. 6, except that semiconductor memory device 700 includes second decoding unit XPDEC2.

Second decoding unit XPDEC2 comprises decoding transistors DTR20, DTR21, DTR22, and DTR23, which are respectively gated by input address signals X0, X1, X2, and X3. Each of decoding transistors DTR20 through DTR23 has a first terminal connected to ground VSS and a second terminal connected to the second terminals of corresponding second transistors in wordline driving circuits WDC0 through WDC1023.

In FIG. 7, first and second decoding units XPDEC1 and XPDEC2 are located on opposite sides of wordline driving circuits WDC0 through WDC1023 so that sub-wordlines SWL0 through SWL1023 can be controlled from both sides. By controlling each sub-wordline using first and second decoding units XPDEC1 and XPDEC2 at the same time, the electrical load on each sub-wordline becomes half of what it is semiconductor memory device 600.

Due to the modified electrical load on each sub-wordline, and an associated change in current, the pitch of the metal lines connected to the second terminals of the second transistors in FIG. 7 can be reduced relative to the pitch of the same metal lines in FIG. 6. Second decoding unit XPDEC2 of FIG. 7 can be shared by an adjacent memory cell block, which will be described later.

Figure 8:
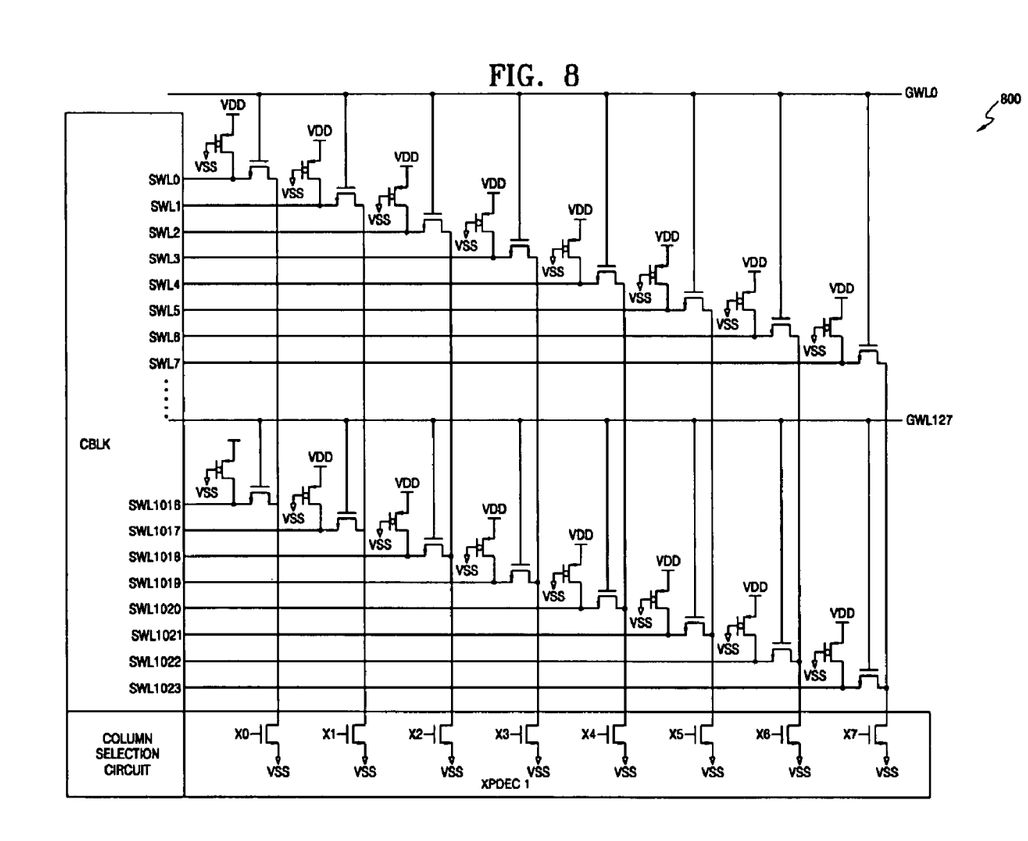

FIG. 8 is a circuit diagram of a semiconductor memory device 800 according to another embodiment of the present invention.

Semiconductor memory device 800 is the same as semiconductor memory device 600, except that each global wordline in semiconductor memory device 800 controls eight (8) sub-wordlines instead of four (4). Accordingly, semiconductor memory device 800 has only 128 global wordlines controlling sub-wordlines SWL0 through SWL1023 instead of 256. In general, any number of sub-wordlines could be controlled by each global wordline.

Figure 9:
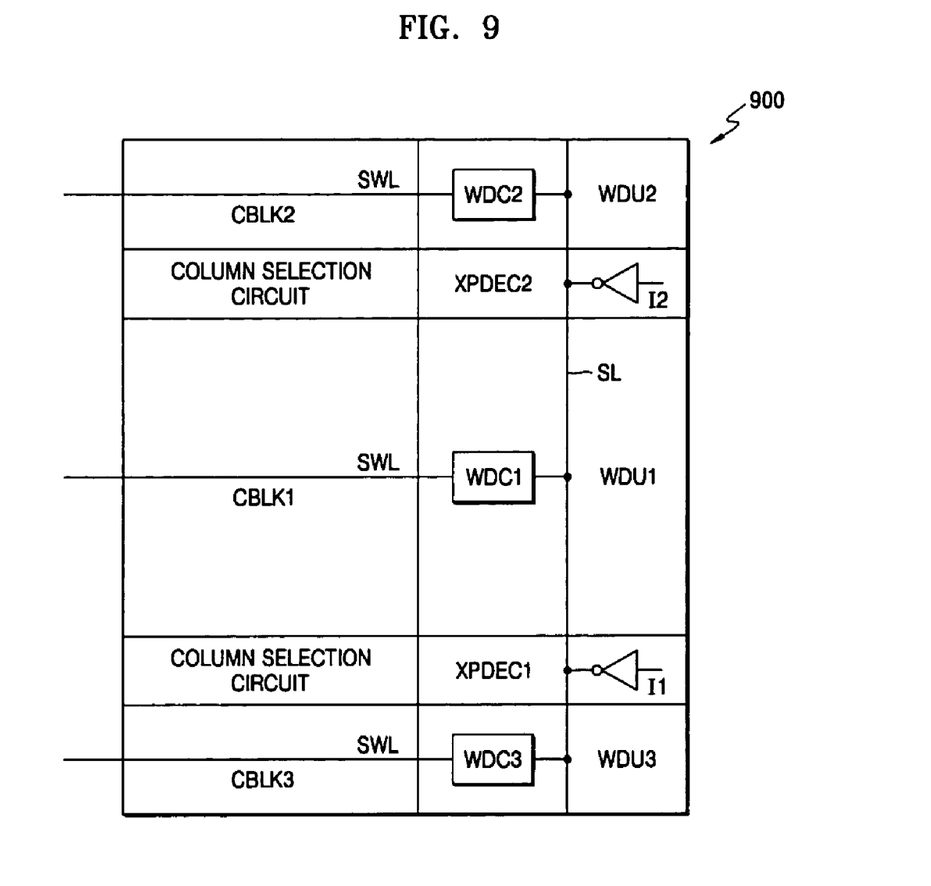

FIG. 9 is a diagram of a semiconductor memory device 900 according to still another embodiment of the present invention.

Referring to FIG. 9, semiconductor memory device 900 comprises a first wordline driving unit WDU1 including a first wordline driving circuit WDC1 and driving a first memory cell block CBLK1, a second wordline driving unit WDU2 including a second wordline driving circuit WDC2 and driving a second memory cell block CBLK2, and a third wordline driving unit WDU3 including a third wordline driving circuit WDC3 and driving a third memory cell block CBLK3.

Semiconductor memory device 900 further comprises a first decoding unit XPDEC1 including a first inverter unit I1, and a second decoding unit XPDEC2 including a second inverter unit I2. First and second inverter units I1 and I2 respectively comprise inverters I10 through I13 and inverters I20 through I23 as shown in FIG. 4. First and second inverter units I1 and I2 both have output terminals connected to first through third wordline driving circuits WDC1 through WDC3. Accordingly, first decoding unit XPDEC1 is shared by memory cell block CBLK1 and memory cell block CBLK3 and second decoding unit XPDEC2 is shared by memory cell block CBLK1 and memory cell block CBLK2. By sharing decoding units between adjacent wordline driving units, semiconductor memory device 900 can achieve higher levels of integration.

In semiconductor memory device 900, first and second decoding units XPDEC1 and XPDEC2 may include decoding transistors DTR10 through DTR13 and DTR20 through DTR23 of FIG. 7 instead of the first and second inverter units I1 and I2.

Figure 10:
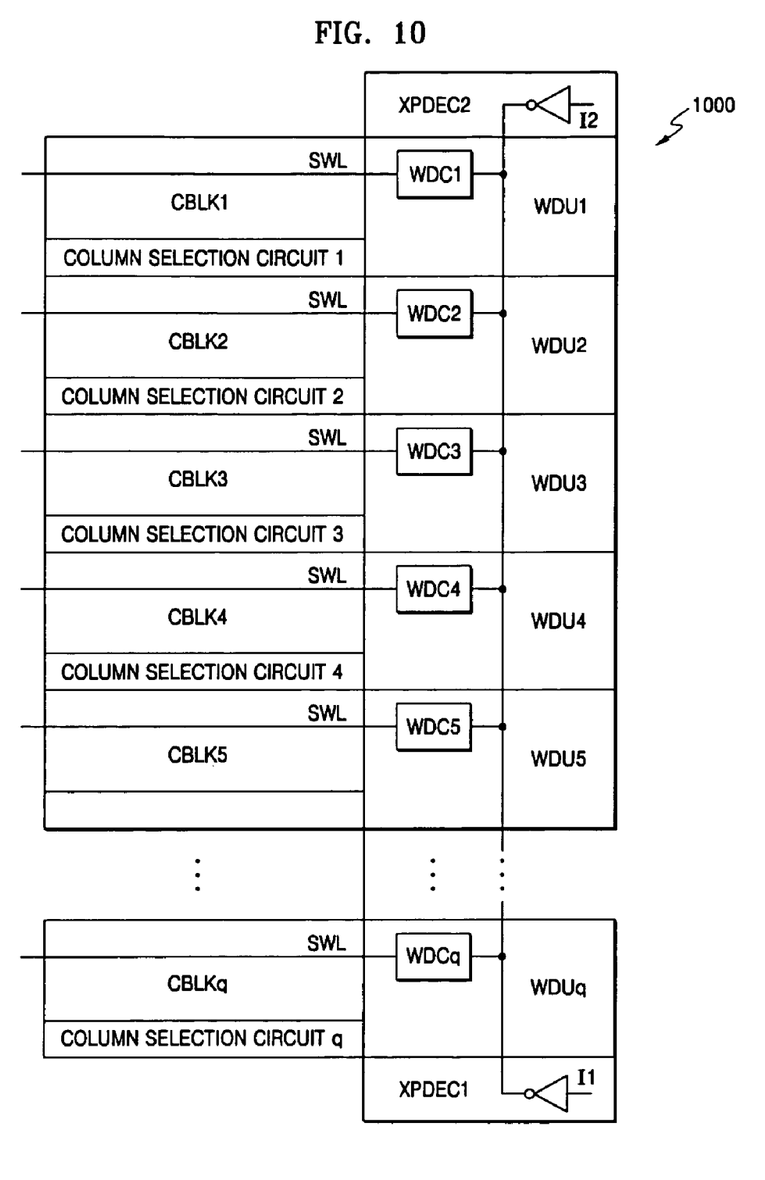

FIG. 10 is a diagram showing a semiconductor memory device 1000 according to another embodiment of the present invention.

Referring to FIG. 10, semiconductor memory device 1000 comprises a plurality of memory cell blocks CBLK1 through CBLKq, each comprising n global wordlines, wherein each global wordline is connected to m sub-wordlines SWL1 through SWLm included in the same memory cell block. Semiconductor memory device 1000 further comprises a plurality of wordline driving units WDU1 through WDUq corresponding to respective memory cell blocks CBLK1 through CBLKq, and controlling sub-wordlines SWL1 through SWLm. Semiconductor memory device 1000 still further comprises a first decoding unit XPDEC1 decoding a m-bit address signal and applying it to corresponding wordline driving units WDU1 through WDUq.

Each of memory cell blocks CBLK1 through CBLKq and wordline driving units WDU1 through WDUq has the same structure as memory cell blocks and wordline driving units in FIG. 3A or FIG. 6. WDC1 through WDCq denote wordline driving circuits included in wordline driving units WDU1 through WDUq, respectively.

Semiconductor memory device 1000 may further include a second decoding unit XPDEC2 like semiconductor memory devices 400 and 700 in FIGS. 4 and 7. Moreover, in semiconductor memory device 1000, all of wordline driving units WDU1 through WDUq driving memory cell blocks CBLK1 through CBLKq share first and second decoding units XPDEC1 and XPDEC2.

In semiconductor memory device 1000, first and second decoding units XPDEC1 and XPDEC2 may include inverters I0 through I3 and I20 through I23 as shown in FIG. 4, or they may include decoding transistors DTR10 through DTR13 and DTR20 through DTR23 as shown in FIG. 7.

In the foregoing exemplary embodiments, a semiconductor memory device comprises wordline driving circuits including only two transistors. The wordline driving circuits take up less space than conventional wordline driving circuits, allowing the semiconductor memory device to achieve a higher degree of integration.

The foregoing exemplary embodiments are teaching examples. Those of ordinary skill in the art will understand that various changes in form and details may be made to the exemplary embodiments without departing from the scope of the present invention which is defined by the following claims.

What is claimed is:

1. A semiconductor memory device, comprising:
   n global wordlines, where n is a positive integer;
   n groups of m sub-wordlines, where m is a positive integer; and,
   n groups of m wordline driving circuits controlling respective voltage levels of the sub-wordlines in response to logic levels of the global wordlines and m address signals;
   wherein each of the wordline driving circuits comprises a first transistor for maintaining a corresponding sub-wordline at a first voltage level and a second transistor for maintaining the corresponding sub-wordline at a second voltage level, wherein second transistor includes a first terminal and a second terminal, and wherein the second terminal is connected to receive an inverted address signal.

2. The semiconductor memory device of claim 1, wherein the first transistor maintains the corresponding sub-wordline at the first voltage level when a corresponding global wordline is at a second logic level; and,
   the second transistor maintains the corresponding sub-wordline at the second voltage level when the corresponding global wordline is at a first logic level.

3. The semiconductor memory device of claim 1, wherein the first voltage level is a power supply voltage and the second voltage level is ground.

4. The semiconductor memory device of claim 1, wherein the first transistor has a first terminal connected to a power supply providing the first voltage level, a gate connected to a corresponding global wordline, and a second terminal connected to the corresponding sub-wordline; and, wherein the first terminal of the second transistor is connected to the second terminal of the first transistor, and a gate of the second transistor is connected to the corresponding global wordline.

5. The semiconductor memory device of claim 4, further comprising:

m first inverters respectively receiving and inverting the m address signals and outputting the inverted m address signals to respective second terminals of the second transistors in the wordline driving circuits.

6. The semiconductor memory device of claim 1, further comprising:

a plurality of memory cells each of which is connected to the sub-wordline, is a phase change random access memory (PRAM), and includes a diode connected between a phase change resistance element connected to a corresponding bitline and a sub-wordline corresponding to the phase change resistance element.

7. A semiconductor memory device, comprising:

n global wordlines, where n is a positive integer;

n groups of m sub-wordlines, where m is a positive integer; and, n groups of m wordline driving circuits controlling respective voltage levels of the sub-wordlines in response to logic levels of the global wordlines and m address signals;

wherein each of the wordline driving circuits comprises a first transistor for maintaining a corresponding sub-wordline at a first voltage level and a second transistor for maintaining the corresponding sub-wordline at a second voltage level wherein the first transistor has a first terminal connected to a power supply providing the first voltage level, a gate connected to a corresponding global wordline, and a second terminal connected to the corresponding sub-wordline;

wherein the semiconductor memory device further comprises m first inverters respectively receiving and inverting the m address signals and outputting the inverted m address signals to respective second terminals of the second transistors in the wordline driving circuits, and m second inverters respectively receiving and inverting the m address signals and outputting the inverted m address signals to the respective second terminals of the second transistors in the wordline driving circuits;

wherein the m first inverters have output terminals connected to respective output terminals of the m second inverters.

8. The semiconductor memory device of claim 7, further comprising:

a plurality of memory cell blocks, each receiving the n global wordlines and the m sub-wordlines;

wherein the m address signals are transferred from the output terminals of the first and second inverters to the wordline driving circuits along selection lines arranged in columns.

9. A semiconductor memory device, comprising:

n global wordlines, where n is a positive integer;

n groups of m sub-wordlines, where m is a positive integer; and, n groups of m wordline driving circuits controlling respective voltage levels of the sub-wordlines in response to logic levels of the global wordlines and m address signals;

wherein each of the wordline driving circuits comprises a first transistor for maintaining a corresponding sub-wordline at a first voltage level and a second transistor for maintaining the corresponding sub-wordline at a second voltage level;

wherein the first transistor has a first terminal connected to a power supply providing the first voltage level, a gate connected to ground, and a second terminal connected to a corresponding sub-wordline; and, wherein the second transistor has a first terminal connected to the second terminal of the first transistor, a gate connected to a corresponding global wordline, and a second terminal.

10. The semiconductor memory device of claim 9, further comprising:

m first decoding transistors connected between respective second terminals of the second transistors in the wordline driving circuits and ground, and gated by the respective m address signals.

11. The semiconductor memory device of claim 10, further comprising:

m second decoding transistors connected between respective second terminals of the second transistors in the wordline driving circuits and ground, and gated by the respective m address signals.

12. The semiconductor memory device of claim 11, further comprising:

a plurality of memory cell blocks, each receiving the n global wordlines and the m sub-wordlines;

wherein the m address signals are transferred from the output terminals of the first and second inverters to the wordline driving circuits along selection lines arranged in columns.

13. A semiconductor memory device comprising:

n global wordlines, where n is a positive integer;

n groups of m sub-wordlines, where m is a positive integer; and, a wordline driving unit driving the sub-wordlines;

wherein the wordline driving unit comprises n groups of m wordline driving circuits controlling respective voltage levels of the sub-wordlines in response to logic levels of the global wordlines and m address signals, wherein each of the wordline driving circuits comprises a first transistor for maintaining a corresponding sub-wordline at a first voltage level and a second transistor for maintaining the corresponding sub-wordline at a second voltage level, wherein second transistor includes a first terminal and a second terminal, and wherein the second terminal is connected to receive an inverted address signal.

14. The semiconductor memory device of claim 13, wherein each of the wordline driving circuits maintains a corresponding sub-wordline at the first voltage level when a corresponding global wordline is at a second logic level and at the second voltage level when the corresponding global wordline is at a first logic level.

15. The semiconductor memory device of claim 13, wherein the first voltage level is a power supply voltage and the second voltage level is ground.

16. The semiconductor memory device of claim 13, wherein:

the first transistor includes a first terminal connected to a power supply providing the first voltage level, a gate connected to a corresponding global wordline, and a second terminal connected to the corresponding sub-wordline; and, the second transistor further includes a gate connected to the corresponding global wordline, wherein the first terminal of the second transistor is connected to the second terminal of the first transistor.

17. The semiconductor memory device of claim 16, further comprising:
m first inverters respectively receiving and inverting the m address signals and outputting the inverted m address signals to respective second terminals of the second transistors in the wordline driving circuits.

18. A semiconductor memory device comprising:
n global wordlines, where n is a positive integer;
n groups of m sub-wordlines, where m is a positive integer; and,
a wordline driving unit driving the sub-wordlines;
wherein the wordline driving unit comprises n groups of m wordline driving circuits controlling respective voltage levels of the sub-wordlines in response to logic levels of the global wordlines and m address signals;
wherein each of the wordline driving circuits comprises a first transistor having a first terminal connected to a power supply providing the first voltage level, a gate connected to a corresponding global wordline, and a second terminal connected to the corresponding sub-wordline, and a second transistor having a first terminal connected to the second terminal of the first transistor, a gate connected to the corresponding global wordline, and a second terminal; and
wherein said semiconductor memory device further comprises m first inverters respectively receiving and inverting the m address signals and outputting the inverted m address signals to respective second terminals of the second transistors in the wordline driving circuits, and m second inverters respectively receiving and inverting the m address signals and outputting the inverted m address signals to the respective second terminals of the second transistors in the wordline driving circuits.

19. The semiconductor memory device of claim 18, further comprising:
a plurality of memory cell blocks, each receiving the n global wordlines and the m sub-wordlines;
wherein the m address signals are transferred from the output terminals of the first and second inverters to the wordline driving circuits along selection lines arranged in columns.

20. A semiconductor memory device comprising:
n global wordlines, where n is a positive integer;
n groups of m sub-wordlines, where m is a positive integer; and,
a wordline driving unit driving the sub-wordlines;
wherein the wordline driving unit comprises n groups of m wordline driving circuits controlling respective voltage levels of the sub-wordlines in response to logic levels of the global wordlines and m address signals; and
wherein each of the wordline driving circuits comprises:
a first transistor having a first terminal connected to a power supply providing the first voltage level, a gate connected to ground, and a second terminal connected to a corresponding sub-wordline; and,
a second transistor having a first terminal connected to the second terminal of the first transistor, a gate connected to a corresponding global wordline, and a second terminal.

21. The semiconductor memory device of claim 20, further comprising:

m first decoding transistors connected between respective second terminals of the second transistors in the wordline driving circuits and ground, and gated by the respective m address signals.

22. The semiconductor memory device of claim 21, further comprising:
m second decoding transistors connected between respective second terminals of the second transistors in the wordline driving circuits and ground, and gated by the respective m address signals.

23. The semiconductor memory device of claim 22, further comprising:
a plurality of memory cell blocks, each receiving the n global wordlines and the m sub-wordlines;
wherein the m address signals are transferred from the output terminals of the first and second inverters to the wordline driving circuits along selection lines arranged in columns.

24. A semiconductor memory device, comprising:
a plurality of memory cell blocks, each receiving n global wordlines and n groups of m sub-wordlines corresponding to the n global wordlines;
a plurality of wordline driving units corresponding to the plurality of memory cell blocks and adapted to control voltage levels of the sub-wordlines received by each memory cell block; and,
a first decoding unit receiving m address signals and applying the m address signals to the wordline driving units;
wherein each of the wordline driving units comprises n groups of m wordline driving circuits, wherein each of the wordline driving circuits is adapted to control the voltage level of a corresponding sub-wordline in response to a logic state of a corresponding one of the global wordlines and a corresponding one of the m address signals, wherein each of the wordline driving circuits comprises a first transistor for maintaining a corresponding sub-wordline at a first voltage level and a second transistor for maintaining the corresponding sub-wordline at a second voltage level, wherein second transistor includes a first terminal and a second terminal, and wherein the second terminal is connected to receive an inverted address signal.

25. The semiconductor memory device of claim 24, wherein:
the first transistor includes a first terminal connected to a power supply providing the first voltage level, a gate connected to a corresponding global wordline, and a second terminal connected to the corresponding sub-wordline; and,
the second transistor further includes a gate connected to the corresponding global wordline, wherein the first terminal of the second transistor is connected to the second terminal of the first transistor.

26. The semiconductor memory device of claim 25, wherein the first decoding unit comprises:
m first inverters respectively receiving and inverting the m address signals and outputting the inverted m address signals to respective second terminals of the second transistors in the wordline driving circuits.

27. A semiconductor memory device, comprising:
a plurality of memory cell blocks, each receiving n global wordlines and n groups of m sub-wordlines corresponding to the n global wordlines;
a plurality of wordline driving units corresponding to the plurality of memory cell blocks and adapted to control voltage levels of the sub-wordlines received by each memory cell block; and, a first and a second decoding unit receiving m address signals and applying the m address signals to the wordline driving units;

wherein each of the wordline driving units comprises n groups of m wordline driving circuits, wherein each of the wordline driving circuits is adapted to control the voltage level of a corresponding sub-wordline in response to a logic state of a corresponding one of the global wordlines and a corresponding one of the m address signals;

wherein each of the wordline driving circuits comprises a first transistor having a first terminal connected to a power supply providing the first voltage level, a gate connected to a corresponding global wordline, and a second terminal connected to the corresponding sub-wordline, and a second transistor having a first terminal connected to the second terminal of the first transistor, a gate connected to the corresponding global wordline, and a second terminal wherein the first decoding unit comprises m first inverters respectively receiving and inverting the m address signals and outputting the inverted m address signals to respective second terminals of the second transistors in the wordline driving circuits; and wherein the second decoding unit comprises m second inverters respectively receiving and inverting the m address signals and outputting the inverted m address signals to the respective second terminals of the second transistors in the wordline driving circuits.

28. A semiconductor memory device, comprising:

a plurality of memory cell blocks, each receiving n global wordlines and n groups of m sub-wordlines corresponding to the n global wordlines;

a plurality of wordline driving units corresponding to the plurality of memory cell blocks and adapted to control voltage levels of the sub-wordlines received by each memory cell block; and, a first decoding unit receiving m address signals and applying the m address signals to the wordline driving units;

wherein each of the wordline driving units comprises n groups of m wordline driving circuits, wherein each of the wordline driving circuits is adapted to control the voltage level of a corresponding sub-wordline in response to a logic state of a corresponding one of the global wordlines and a corresponding one of the m address signals;

wherein each of the wordline driving circuits comprises:

a first transistor having a first terminal connected to a power supply supplying the first voltage level, a gate connected to ground voltage, and a second terminal connected to a corresponding sub-wordline; and, a second transistor having a first terminal connected to the second terminal of the first transistor, a gate connected to a corresponding global wordline, and a second terminal.

29. The semiconductor memory device of claim 28, wherein the first decoding unit comprises:

m first decoding transistors connected between respective second terminals of the second transistors in the wordline driving circuits and ground, and gated by the respective m address signals.

30. The semiconductor memory device of claim 29, wherein the second decoding unit comprises:

m second decoding transistors connected between respective second terminals of the second transistors in the wordline driving circuits and ground, and gated by the respective m address signals.

* * * * *